(12) United States Patent
Nasu et al.

(10) Patent No.: US 10,674,614 B2
(45) Date of Patent: Jun. 2, 2020

(54) WIRING SUBSTRATE FOR ELECTRONIC COMPONENT INSPECTION APPARATUS

(71) Applicant: NGK SPARK PLUG CO., LTD., Nagoya, Aichi (JP)

(72) Inventors: Takakuni Nasu, Komaki (JP); Masaomi Hattori, Komaki (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/143,698

(22) Filed: Sep. 27, 2018

(65) Prior Publication Data
US 2019/0098769 A1   Mar. 28, 2019

(30) Foreign Application Priority Data
Sep. 28, 2017   (JP) .................................. 2017-187789

(51) Int. Cl.
*H05K 3/46*   (2006.01)
*H05K 1/11*   (2006.01)
(Continued)

(52) U.S. Cl.
CPC ....... *H05K 3/4626* (2013.01); *G01R 1/07307* (2013.01); *G01R 1/07314* (2013.01); *H05K 1/0306* (2013.01); *H05K 1/111* (2013.01)

(58) Field of Classification Search
None
See application file for complete search history.

(56) References Cited

U.S. PATENT DOCUMENTS 4,221,647 A * 9/1980 Turpin ................. C09D 5/4407
                                                      204/495
4,245,273 A * 1/1981 Feinberg ............. H01L 23/4338
                                                      257/714
(Continued)

FOREIGN PATENT DOCUMENTS

JP   2011-142282 A   7/2011
JP   2011-165945 A   8/2011
(Continued)

OTHER PUBLICATIONS

Korean Intellectual Property Office, Office Action (Notification of Reason for Refusal) issued in corresponding Application No. 10-2018-0113481 dated Mar. 20, 2020.

*Primary Examiner* — Timothy J Thompson
*Assistant Examiner* — Muhammed Azam
(74) *Attorney, Agent, or Firm* — Stites & Harbison, PLLC; Jeffrey A. Haeberlin; James R. Hayne

(57) ABSTRACT

A wiring substrate for electronic component inspection apparatus includes a first laminate which is formed by stacking a plurality of ceramic layers and which has a front surface and a back surface, and a plurality of studs joined to the back surface of the first laminate Each of the studs is composed of a flange portion which is circular in bottom view, and a bolt portion which perpendicularly extends from a center portion of an outside surface of the flange portion. The flange portion has a truncated conical shape and the outside surface from which the bolt portion protrudes, such that the outside surface slopes from the proximal end side of the bolt portion toward the peripheral edge of the flange portion and gradually approaches the inside surface of the flange portion.

4 Claims, 2 Drawing Sheets

(51) Int. Cl.
*H05K 1/03* (2006.01)
*G01R 1/073* (2006.01)

(56) References Cited

U.S. PATENT DOCUMENTS

| | | | | |
|---|---|---|---|---|
| 4,322,120 A * | 3/1982 | Rilling | H01R 12/716 | 439/631 |
| 4,420,767 A * | 12/1983 | Hodge | H01L 23/047 | 257/687 |
| 4,600,261 A * | 7/1986 | Debbaut | H01B 17/60 | 174/76 |
| 4,622,058 A * | 11/1986 | Leary-Renick | H01L 21/48 | 216/65 |
| 4,827,083 A * | 5/1989 | Inasaka | H01L 23/49883 | 174/264 |
| 4,835,859 A * | 6/1989 | Beckett | H05K 3/4007 | 174/261 |
| 5,317,255 A * | 5/1994 | Suyama | G01R 1/07342 | 324/755.09 |
| 5,408,190 A * | 4/1995 | Wood | G01R 1/0466 | 257/E21.525 |
| 5,455,391 A * | 10/1995 | Demesmaeker | B25B 23/0064 | 174/93 |
| 5,766,022 A * | 6/1998 | Chapin | H01L 23/3675 | 257/E23.078 |
| 5,825,632 A * | 10/1998 | Tanei | C03C 3/089 | 361/795 |
| 5,914,614 A * | 6/1999 | Beaman | G01R 3/00 | 324/755.07 |
| 6,181,567 B1 * | 1/2001 | Roemer | H05K 3/325 | 174/255 |
| 6,201,706 B1 * | 3/2001 | Gustavsen | H02M 1/44 | 174/51 |
| 6,329,827 B1 * | 12/2001 | Beaman | G01R 1/06727 | 324/755.07 |
| 6,583,635 B2 * | 6/2003 | Hembree | G01R 1/0433 | 324/750.05 |
| 6,724,208 B2 * | 4/2004 | Matsunaga | G01R 1/06761 | 324/755.11 |
| 6,970,005 B2 * | 11/2005 | Rincon | G01R 1/07378 | 324/756.03 |
| 7,227,759 B2 * | 6/2007 | Grundy | H01R 23/70 | 361/785 |
| 7,279,917 B2 * | 10/2007 | Williams | G01R 1/06716 | 324/755.07 |
| 7,407,877 B2 * | 8/2008 | Kweon | H01L 23/49816 | 438/612 |
| 8,072,771 B2 * | 12/2011 | Song | H05K 3/366 | 361/767 |
| 9,642,240 B2 * | 5/2017 | Zacharko | H05K 1/0265 | |
| 2001/0040460 A1 * | 11/2001 | Beaman | G01R 1/07378 | 324/762.02 |
| 2001/0054907 A1 * | 12/2001 | Beaman | G01R 1/06733 | 324/755.07 |
| 2003/0224558 A1 * | 12/2003 | Cromwell | H01L 23/4006 | 438/118 |
| 2004/0085742 A1 * | 5/2004 | Ito | H01G 2/06 | 361/782 |
| 2004/0130343 A1 * | 7/2004 | Beaman | G01R 1/06711 | 324/755.01 |
| 2005/0146340 A1 * | 7/2005 | Clark | G01D 11/245 | 324/756.07 |
| 2006/0071680 A1 * | 4/2006 | Behziz | G01R 31/2889 | 324/756.07 |
| 2006/0280919 A1 * | 12/2006 | Urashima | H01L 23/15 | 428/209 |
| 2007/0089551 A1 * | 4/2007 | Williams | G01R 1/06727 | 73/866.5 |
| 2007/0117417 A1 * | 5/2007 | O'Brien | H05K 1/142 | 439/65 |
| 2008/0146092 A1 * | 6/2008 | Taylor | H01R 11/26 | 439/883 |
| 2008/0250377 A1 * | 10/2008 | Bird | G01R 31/2818 | 716/137 |
| 2008/0272794 A1 * | 11/2008 | Grube | G01R 1/07314 | 324/754.07 |
| 2009/0058425 A1 * | 3/2009 | Bartley | G01R 31/2808 | 324/537 |
| 2009/0116204 A1 * | 5/2009 | Chen | H01G 4/38 | 361/763 |
| 2009/0190317 A1 * | 7/2009 | Monda | H05K 1/0268 | 361/759 |
| 2010/0008048 A1 * | 1/2010 | Urai | H01L 23/4006 | 361/717 |
| 2010/0177492 A1 * | 7/2010 | Park | H05K 1/0246 | 361/782 |
| 2011/0242721 A1 * | 10/2011 | Chen | H05K 1/0254 | 361/131 |
| 2012/0268104 A1 * | 10/2012 | Huang | G06F 11/221 | 324/76.12 |
| 2013/0223031 A1 * | 8/2013 | Schmieder | B81B 7/0006 | 361/760 |
| 2015/0052722 A1 * | 2/2015 | Ke | H01L 21/6835 | 29/281.5 |
| 2015/0055302 A1 * | 2/2015 | Nagatomo | B32B 9/005 | 361/709 |
| 2016/0323996 A1 | 11/2016 | Takemura | | |
| 2017/0146570 A1 * | 5/2017 | Takemura | H05K 1/036 | |
| 2018/0177007 A1 * | 6/2018 | Mehnert | H05K 3/303 | |
| 2019/0082531 A1 * | 3/2019 | Nasu | H05K 1/0268 | |
| 2019/0098769 A1 * | 3/2019 | Nasu | H05K 3/4626 | |
| 2019/0098770 A1 * | 3/2019 | Nasu | H05K 3/4626 | |

FOREIGN PATENT DOCUMENTS

| | | |
|---|---|---|
| JP | 2013-021359 A | 1/2013 |
| WO | 2015/108051 A1 | 7/2015 |

\* cited by examiner

WIRING SUBSTRATE FOR ELECTRONIC COMPONENT INSPECTION APPARATUS

TECHNICAL FIELD

The present invention relates to a wiring substrate for use in an electronic component inspection apparatus for inspecting electrical characteristics of a large number of electronic components, for example, semiconductor devices, formed along the surface of a silicon wafer.

BACKGROUND ART

In order to adjust the posture of the wiring substrate in the inspection apparatus for bringing a plurality of probe pins into uniform and individual contact with the large number of electronic components, the wiring substrate has studs each of which has a bolt and a flat flange having a circular shape in plan view. The flanges of the studs are joined to the back surface of the wiring substrate opposite its front surface having pads for probe for disposing the probe pins, in such a manner that the bolts become perpendicular to the back surface. For example, regarding the case where, on the back surface to which the studs are joined, via conductors (conductors for connection between adjacent layers) are located at positions around the studs, in order for the substrate to be less susceptible to occurrence of cracking in the vicinity of the via conductors even in the event of application of a large external force to the studs, there have been proposed a multilayer ceramic substrate in which a relation is specified for, for example, the distance between the center axis of the via conductor and the circumcircle of a brazing material layer used to join the stud to a surface metal layer formed on the back surface, as well as a method of manufacturing the multilayer ceramic substrate (see, for example, Patent Document 1).

However, the multilayer ceramic substrate and the method of manufacturing the same have the following problem. In the case where a large external force which pulls a stud outward along the axial direction of its bolt is applied to the stud, a shearing force along the thickness direction of the multilayer substrate acts between the peripheral edge of the flat flange of the stud and the back surface of the multilayer ceramic substrate. As a result, a crack along the thickness direction of the substrate may be generated in the ceramic near a region of the back surface of the multilayer substrate, which region is located adjacent to the peripheral edge of the flange of the stud. In the case where such a crack is generated, it becomes difficult to accurately inspect a plurality of electronic components to be inspected, and the multilayer ceramic substrate itself breaks.

PRIOR ART DOCUMENT

Patent Document

[Patent Document 1] Japanese Patent Application Laid-Open (kokai) No. 2011-165945 (pages 1 to 20, FIGS. 1 to 7)

SUMMARY OF THE INVENTION

Problem to be Solved by the Invention

An object of the present invention is to solve the problems described above in the section Background Art and to provide a wiring substrate for electronic component inspection apparatus which includes a substrate main body including a first laminate formed of ceramic and a plurality of studs joined to the back surface of the first laminate and in which, even when an axial external force is applied to a bolt portion or nut tube portion of a stud, a crack is less likely to be generated in the ceramic in a region of the back surface of the first laminate, which region is located adjacent to the circumferential edge of a flange portion of the stud.

Means for Solving the Problem and Effect of the Invention

In order to solve the above problem, the present invention has been conceived according to the following idea: the outside surface of the flange portion of the stud is formed into a truncated conical shape such that the outside surface slopes from the center side of the outside surface toward the peripheral edge side thereof and gradually approaches the inside surface of the flange portion.

Specifically, the wiring substrate for electronic component inspection apparatus of the present invention (claim 1) is a wiring substrate for electronic component inspection apparatus comprising a first laminate which is formed by stacking a plurality of ceramic layers and which has a front surface and a back surface, and a plurality of studs joined to the back surface of the first laminate, the wiring substrate for electronic component inspection apparatus being characterized in that each of the studs is composed of a flange portion which is circular in bottom view, and a bolt portion or a nut tube portion which perpendicularly extends from a center portion of an outside surface of the flange portion; and the flange portion has a truncated conical shape and the outside surface from which the bolt portion or the nut tube portion protrudes, such that the outside surface slopes from a proximal end side of the bolt portion or a proximal end side of the nut tube portion toward a peripheral edge of the flange portion and gradually approaches an inside surface of the flange portion.

The wiring substrate for electronic component inspection apparatus yields the following effect (1).

(1) The outside surface of the flange portion of the stud slopes such that the outside surface has a truncated conical shape; i.e., the outside surface slopes toward the peripheral edge of the flange portion from the proximal end side of the bolt portion or the nut tube portion perpendicularly provided at the center portion of the outside surface such that the outside surface gradually approaches the inside surface of the flange portion. Therefore, when an external force in a direction away from the back surface of the first laminate acts on the stud along the axial direction of the bolt portion or the nut tube portion, the stress (component force) of the external force acting on the peripheral edge of the above-mentioned flange portion, which edge has a relatively small thickness, is mitigated. Accordingly, it is possible to reliably prevent or restrain generation of a crack in the ceramic layer near a region of the back surface of the first laminate, which region is located adjacent to the peripheral edge of the above-mentioned flange portion.

Notably, the ceramic layers constituting the first laminate are formed of a low-temperature-firing ceramic, such as glass-ceramic, or a high-temperature-firing ceramic, such as alumina.

Also, inner wiring layers and via conductors are formed as appropriate in the first laminate in a mutually electrically communicating manner. The inner wiring layers and via conductors are formed of copper or a copper alloy, silver or a silver alloy, or tungsten or molybdenum.

Further, the stud is formed of, for example, Kovar (Fe-29% Ni-17% Co), 42 alloy (Fe-42% Ni), 194 alloy (Cu-2.3% Fe-0.03% P), or stainless steel.

In addition, in the case where the diameter of the flange portion of the stud is, for example, 10 to 14 mm, the thickness of the center portion of the flange portion is 3 to 7 mm. The thread (thread nominal diameter) of the bolt portion or nut tube portion of the stud is, for example, M4 or M5.

Also, the present invention encompasses a wiring substrate for electronic component inspection apparatus in which, in a vertical cross section along the axial direction of the bolt portion or the nut tube portion, the outside surface of the flange portion of the stud is defined by a single sloping line or a plurality of sloping lines (claim 2).

Of the above-mentioned two embodiments, the embodiment in which the outside surface of the flange portion is defined by a plurality of sloping lines in the vertical cross section along the axial direction of the bolt portion or the nut tube portion can make the sloping surface of the outside surface on the peripheral edge side smaller than the sloping surface of the outside surface on the center side in terms of the sloping angle in relation to the back surface of the first laminate and the thickness. Accordingly, the above-described effect (1) can be attained more reliably.

Notably, the sloping line which defines the outside surface of the flange portion slopes at an angle of 5 degrees to 20 degrees (for example, 8 degrees or 15 degrees) in relation to the back surface of the first laminate.

Further, the present invention encompasses a wiring substrate for electronic component inspection apparatus in which each of the studs has an annular surface which has a length of 200 μm or less along the axial direction of the bolt portion or the nut tube portion and which is located between a peripheral edge of the outside surface of the flange portion of the stud and a peripheral edge of the inside surface of the flange portion of the stud (claim 3).

In this case, in addition to the above-described effect (1), the following effect (2) can be attained.

(2) The peripheral portion of the brazing material layer disposed between the inside surface of the flange portion and a metal layer (which will be described later) has a fillet shape formed as a result of expanding, due to wetting, along the axial direction of the above-mentioned annular surface. As a result, it is possible to prevent the peripheral portion of the brazing material layer from accidentally extending, due to wetting, into a region of the back surface of the first laminate, which region is located outside the metal layer. Accordingly, it is possible to prevent accidental formation of short circuits between the studs and, for example, connection terminals formed on the back surface of the first laminate at a fine pitch such that the connection terminals are located adjacent to the respective studs.

Notably, the lower limit of the length of the annular surface along the axial direction is 100 μm.

Also, the present invention encompasses a wiring substrate for electronic component inspection apparatus in which each of the studs is joined to the back surface of the first laminate via a brazing material layer which is disposed between the inside surface of the flange portion of the stud and a metal layer formed on the back surface of the first laminate (claim 4).

In this case, since the inside surface of the flange portion of the stud can be easily brazed to the metal layer which is previously formed on the back surface of the first laminate formed of ceramic, the above-described effect (1) can be attained more reliably.

Notably, the metal layer is formed by, for example, sequentially laminating a thin film layer of titanium formed by sputtering, a thin film layer of copper formed by sputtering, a layer of nickel formed by electroplating, and a layer of copper formed by electroplating, and covering the entire outside surfaces of these layers with a film of gold formed by electroplating film.

Also, the brazing material which becomes the brazing material layer is, for example, gold brazing material or silver brazing material. Examples of the gold brazing material include Au—Sn alloy and Au—Cu alloy. Examples of the silver brazing material include Ag—Cu alloy and Ag—Cu—Zn alloy.

Further, the above-described brazing material is supplied in a molten state to the surface of the metal layer or the inside surface of the flange portion of the stud through use of a dispenser. Alternatively, the above-described brazing material is preformed into a shape similar to the outer shape of the flange portion in plan view and is disposed on the surface of the metal layer or the inside surface of the flange portion.

Additionally, the present invention encompasses a wiring substrate for electronic component inspection apparatus in which a second laminate formed by stacking a plurality of resin layers is disposed on the front surface of the first laminate, and a plurality of pads for probe is formed on a front surface of the second laminate.

In this case, in addition to the above-described effects (1) and (2), the following effect (3) can be attained.

(3) By adjusting, through the plurality of studs, the posture of the present wiring substrate with respect to a surface of a silicon wafer or the like to be inspected, the probe pins which are individually disposed on the upper surfaces of the plurality of pads for probe later on can be easily disposed at a fine pitch (very narrow spacing). Thus, it becomes possible to individually bring the probe pins into contact with a plurality of electronic components formed on the surface of the silicon wafer or the like, and accurately and quickly perform a desired electrical inspection.

Notably, the probe pins are individually disposed on the pads for probe later on.

Also, the resin layers of the second laminate are formed of, for example, polyimide, which is excellent in heat resistance, and inner wiring layers and via conductors are also formed as appropriate in the second laminate in a mutually electrically communicating manner. The inner wiring layers and via conductors are formed of copper or a copper alloy, or silver or a silver alloy.

MODES FOR CARRYING OUT THE INVENTION

Embodiments of the present invention will next be described.

Figure 1:
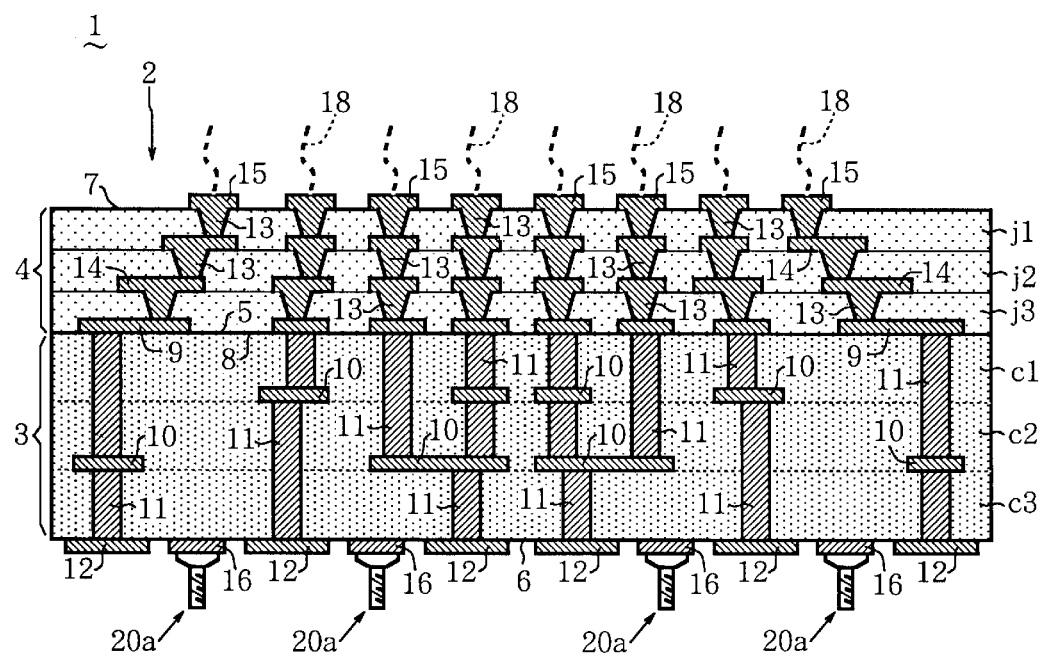
FIG. 1 Vertical cross sectional view showing a wiring substrate for electronic component inspection apparatus according to an embodiment of the present invention.
Figure 2:
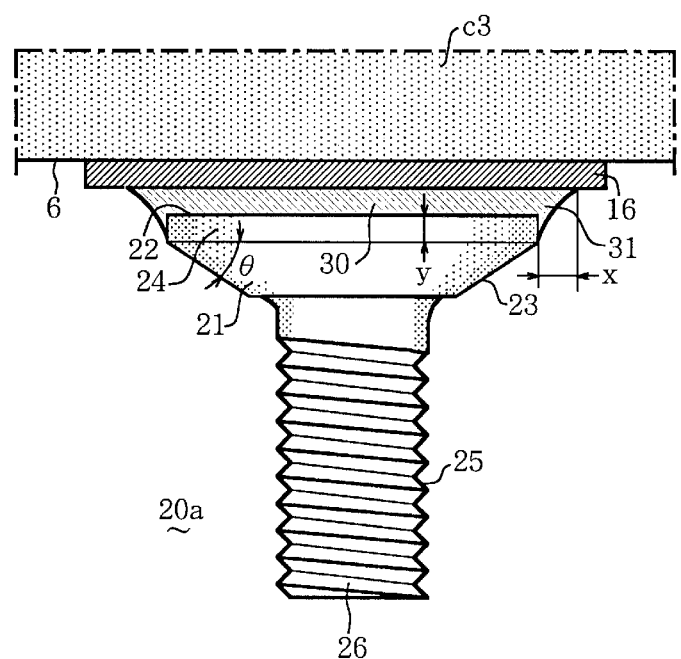
FIG. 2 Enlarged view showing one stud and its vicinity in the vertical cross sectional view of the wiring substrate.

FIG. 1 is a vertical cross sectional view showing a wiring substrate for electronic component inspection apparatus (hereinafter, referred to merely as the wiring substrate) 1 according to an embodiment of the present invention. FIG. 2 is an enlarged view showing one stud 20a and its vicinity in the wiring substrate 1.

As shown in FIG. 1, the wiring substrate 1 includes a substrate main body 2 which is composed of a first laminate 3 formed of ceramic and a second laminate 4 stacked on a front surface 5 of the first laminate 3 and formed of resin; and a plurality of studs 20a joined to a back surface 6 of the first laminate 3.

As shown in FIG. 1, the first laminate 3 includes three (a plurality of) ceramic layers c1 to c3 stacked together and has the front surface 5 and the back surface 6 which face each other. A plurality of surface wiring layers 9 are formed on the front surface 5, and a plurality of inner wiring layers 10 are formed between the ceramic layers c1 to c3. A plurality of connection terminals 12 are formed on the back surface 6 such that the connection terminals 12 are located adjacent to the respective studs 20a and are spaced from one another.

The surface wiring layers 9, the inner wiring layers 10, and the connection terminals 12 are electrically connected through via conductors 11 arbitrarily penetrating the ceramic layers c1 to c3.

Notably, the ceramic layers c1 to c3 are formed of, for example, glass-ceramic, and the surface wiring layers 9, the inner wiring layers 10, the via conductors 11, and the connection terminals 12 are formed of, for example, copper or a copper alloy.

Also, as shown in FIG. 1, the second laminate 4 includes three (a plurality of) resin layers j1 to j3 stacked together and has a front surface 7 and a back surface 8 which face each other. A plurality of pads for probe 15 are formed on the front surface 7, and a plurality of inner wiring layers 14 are formed between the resin layers j1 to j3. As shown in FIG. 1, probe pins 18 are individually disposed on the upper surfaces of the pads for probe 15 later on.

Through via conductors (filled vias) 13 which individually penetrate the resin layers j1 to j3, the pads for probe 15 are electrically connected to the inner wiring layers 14, and the inner wiring layers 14 at one inter-layer boundary are electrically connected to the inner wiring layers 14 at the other inter-layer boundary.

Notably, the resin layers j1 to j3 are formed of, for example, polyimide which is excellent in heat resistance, and the via conductors 13, the inner wiring layers 14, and the pads for probe 15 are formed of, for example, copper or a copper alloy.

Also, the front surface 5 of the first laminate 3 and the back surface 8 of the second laminate 4 are joined to each other via an unillustrated adhesive layer such that the via conductors 13 penetrating the resin layer j3 are electrically connected to the surface wiring layers 9 of the first laminate 3.

Further, as shown in FIG. 1, the plurality of metal layers 16 are formed on the back surface 6 of the first laminate 3 such that the metal layers 16 are located adjacent to the corresponding connection terminals 12. Each metal layer 16 is formed as follows. A thin film layer of titanium formed by sputtering, a thin film layer of copper formed by sputtering, a layer of copper formed by electroplating, and a layer of nickel formed by electroplating are sequentially laminated on the back surface 6 of the ceramic layer c3 along the thickness direction, and the entire outside surfaces of these layers are covered with a film of gold formed by electroplating (these layers are unillustrated).

As shown in FIG. 2, each stud 20a is joined to the surface of the corresponding metal layer 16 via a brazing material layer 30. The stud 20a is a single member formed of, for example, Kovar and includes a flange portion 21 having a truncated conical shape as a whole and a bolt portion 26 which perpendicularly extends from a center portion of an outside surface 23 of the flange portion 21 (a surface opposite a surface facing the back surface 6 of the first laminate 3) in plan view. The flange portion 21 has an inside surface 22 (a surface facing the back surface 6 of the first laminate 3) which has a circular shape in plan view, an outside surface 23 which extends from the proximal end side of the bolt portion 26 toward the peripheral edge of the flange portion 21 and slopes such that the outside surface 23 gradually approaches the inside surface 22, and a ring-shaped annular surface 24 which is located between the peripheral edge of the outside surface 23 and the peripheral edge of the inside surface 22. A length y of the annular surface 24 in the axial direction is equal to or less than 200 μm.

The sloping angle θ of the outside surface 23 in relation to inside surface 22 of the flange portion 21 falls within the range of 5 degrees to 20 degrees (for example, 15 degrees). Namely, the outside surface 23 is composed of a single sloping surface. Also, an external thread 25 is spirally formed, through cutting, on the outer circumferential surface of the bolt portion 26.

In the case where the diameter of the flange portion 21 is, for example, 10 to 14 mm, the thickness of the center portion of the flange portion 21 is 3 to 7 mm, and the external thread 25 of the bolt portion 26 of the stud 20a including the flange portion 21 is, for example, M4.

As shown in FIG. 2, the disk-shaped brazing material layer 30 is disposed between the metal layer 16 and the flange portion 21 of the stud 20a, and the stud 20a is joined to the back surface 6 of the first laminate 3 via the brazing material layer 30 and the metal layer 16.

The brazing material layer 30 is formed of, for example, Au-Su alloy and has a peripheral portion 31 which protrudes from the peripheral edge of the flange portion 21 of the stud 20a in the outward direction (radial direction) such that its length x in the radial direction is 200 μm or less. The peripheral portion 31 has a fillet which has an approximately L-shaped vertical cross section and extends along the surface of the metal layer 16 and the annular portion 24.

Figure 3:
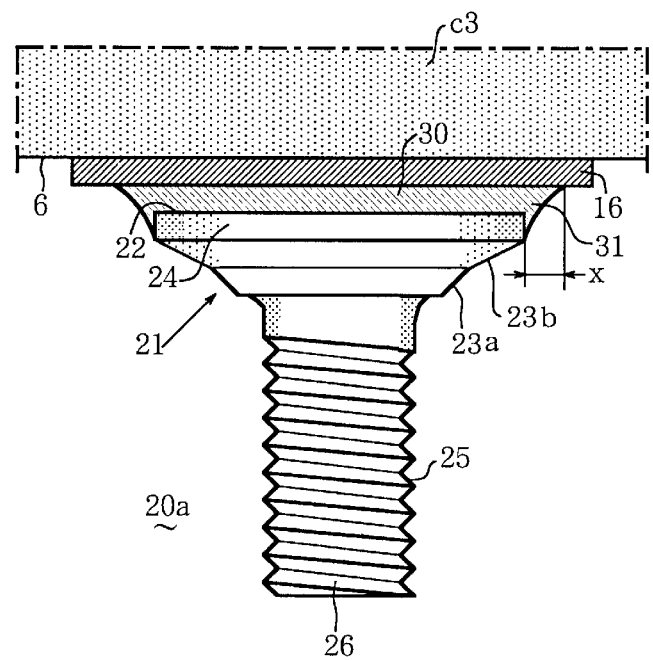
FIG. 3 Enlarged view which is similar to the above-described view and which shows a stud according to a different embodiment and its vicinity.

FIG. 3 is an enlarged fragmentary view which is similar to FIG. 2 and which shows a different embodiment of the stud 20a. As shown in FIG. 3, the stud 20a has a flange portion 21 and a bolt portion 26 which are similar to those of the above-described stud. The outside surface of the flange 21 is composed of two sloping surfaces; i.e., a sloping surface (outside surface) 23a on the center side in plan view, and a sloping surface (outside surface) 23b on the peripheral side in plan view. Of these sloping surfaces, the sloping surface 23b on the peripheral side has a relatively small (gentle) sloping angle in relation to the inside surface 22 of the flange portion 21 as compared with the sloping surface 23a on the center side.

Figure 4:
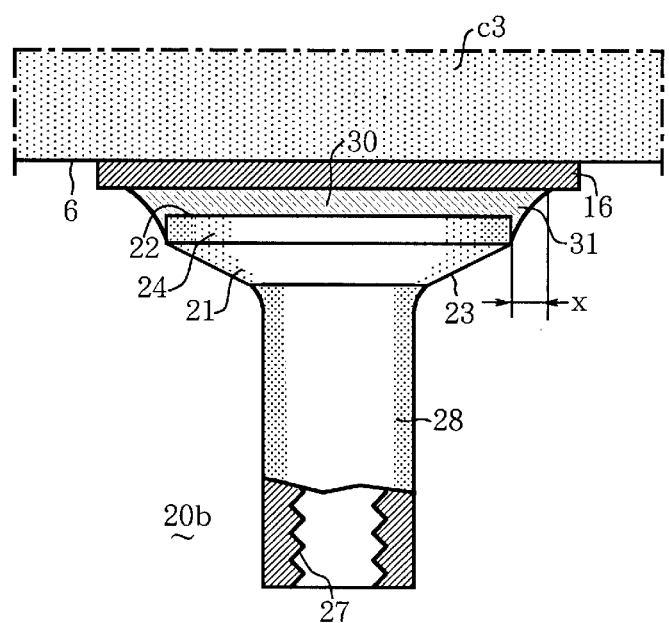
FIG. 4 Enlarged view which is similar to the above-described view and which shows a stud according to another different embodiment and its vicinity.

FIG. 4 is an enlarged fragmentary view which is similar to the above-described view and which shows a stud 20b according to a different embodiment.

The stud 20b is a single member formed of Kovar which is similar to that of the above-described embodiment. As shown in FIG. 4, the stud 20b includes a flange portion 21 which is similar to that of the above-described embodiment and a nut tube portion 28 which perpendicularly extends from a center portion of the outside surface 23 of the flange portion 21 and which has a circular columnar shape as a whole. The nut tube portion 28 has an axially extending internal thread 27 which is spirally formed, through cutting, in its hollow portion extending along the center axis. Notably, the outside surface 23 of the flange portion 21 may be composed of the above-described two sloping surfaces 23a and 23b.

According to the wiring substrate 1 of the present invention having been described above, the outside surface 23 of the flange portion 21 of each of the studs 20a and 20b slopes such that the outside surface 23 has a truncated conical shape; i.e., the outside surface 23 slopes from the proximal end of the bolt portion 26 or the nut tube portion 28, which is perpendicularly provided at the center portion of the outside surface 23, toward the peripheral edge of the flange portion 21 and gradually approaches the inside surface 22 of the flange portion 21. Therefore, when an external force toward the outer side of the back surface 6 of the first laminate 3 acts on the stud 20a or 20b along the axial direction of the bolt portion 26 or the nut tube portion 28, the stress (component force) of the external force acting on a part of the flange portion 21, which part is located on the annular surface 24 side and has a relatively small thickness is mitigated. Accordingly, it is possible to reliably prevent or restrain generation of a crack in the ceramic layer c3 near a region of the back surface 6 of the first laminate 3, which region is located adjacent to the peripheral edge of the flange portion 21. The above-mentioned effect (1) can be obtained more remarkably in the above-described embodiment in which the outside surface 23 of the flange portion 21 is composed of the two sloping surfaces 23a and 23b.

Also, the peripheral portion 31 of the brazing material layer 30 that is disposed between the metal layer 16 and the inside surface 22 of the flange portion 21 has a fillet shape formed as a result of expanding, due to wetting, along the axial direction of the annular surface 24. As a result, it is possible to prevent the peripheral portion 31 of the brazing material layer 30 from accidentally protruding into a region of the back surface 6 of the first laminate 3, which region is located outside the metal layer 16. Therefore, it is possible to prevent accidental formation of short circuits between the studs 20a or 20b and the connection terminals 12 or the like formed on the back surface 6 at a fine pitch such that the connection terminals 12 or the like are located adjacent to the respective studs.

Further, by adjusting, through the plurality of studs 20a or 20b, the posture of the wiring substrate 1 with respect to a surface of a silicon wafer or the like to be inspected, the probe pins 18 which are individually implanted in the upper surfaces of the plurality of pads for probe 15 later on can be individually brought into contact with a plurality of electronic components formed on the surface of the silicon wafer or the like, whereby a desired electrical inspection can be performed accurately.

Accordingly, the wiring substrate 1 can yield the aforementioned effects (1) to (3) without fail.

EXAMPLES

Here, examples of the wiring substrate 1 of the present invention will be described.

Twenty substrate main bodies 2 were manufactured in advance by stacking a first laminate 3 and a second laminate 4. The first laminates 3 of the substrate main bodies 2 were formed of the same glass-ceramic and had the same overall thickness and dimensions. The second laminates 4 of the substrate main bodies 2 were formed of the same polyimide resin and had the same overall thickness and dimensions. One metal layer 16 was formed on a center portion of the back surface 6 of the first laminate 3 of each substrate main body. The metal layers 16 of the substrate main bodies 2 were formed of the same material and had the same structure.

Studs 20a formed of the same Kovar and having flange portions 21 and bolt portions 26 having the same shapes and dimensions were joined to ten substrate main bodies 2 of the above-described twenty substrate main bodies 2. Specifically, the studs 20a were joined to the surfaces of the metal layers 16 via brazing materials made of the same Au-Su alloy and previously preformed into discs having the same dimensions. The outside surface 23 of each flange portion 21 had a sloping angle of 8 degrees in relation to the inside surface 22 of the flange portion 21. Such ten substrate main bodies 2 were used as Examples.

Meanwhile, studs formed of the same Kovar and having flange portions and bolt portions 26 having the same shapes and dimensions were joined to the remaining ten substrate main bodies 2 of the above-described twenty substrate main bodies 2. Specifically, the studs were joined to the surfaces of the metal layers 16 via brazing materials made of the same Au-Su alloy and previously preformed into discs having the same dimensions. The entire flange portion had the same thickness as the thickness of the center portion of the flange portion 21 of the stud 20a and was flat. Such ten substrate main bodies 2 were used as Comparative Examples.

The following measurement was performed for each of the substrate main bodies 2 of Examples and Comparative Examples. The bolt portion 26 was pulled in the axial direction, and the load (breaking strength) at which a crack was generated in a region of the back surface 6 of the first laminate 3, the region being located adjacent to the periphery of the flange portion (21) was measured.

All the breaking strengths (N: newton) of the substrate main bodies 2 of Examples were in a high range of about 1000 to 1350 N. In contrast, all the breaking strengths (N) of the substrate main bodies 2 of Comparative Examples were in a low range of about 600 to 650 N.

The superiority of the present invention was proved by the examples as described above.

The present invention is not limited to the above-described embodiments and examples.

For example, the number of the ceramic layers constituting the first laminate 3 may be two or four or more, and the ceramic of the ceramic layers may be alumina, aluminum nitride, or mullite.

Also, the number of the resin layers constituting the second laminate 4 may be two or four or more, and the resin layers may be formed of epoxy resin.

Further, the studs 20a and 20b may be formed of 42 alloy, 194 alloy, or any one of various types of stainless steels.

Further, the flange portion 21 of each of the studs 20a and 20b may be configured such that the outside surface 23 of the flange portion 21 has three or more sloping surfaces which are arranged concentrically in plan view.

In addition, the stud 20a may have an internal thread hole which extends along the center axis of the bolt portion 26 and which has an internal thread 27 formed on the inner circumferential surface thereof through cutting, and the stud 20b may have an external thread 25 which is formed on the outer circumferential surface of the nut tube portion 28 through cutting.

INDUSTRIAL APPLICABILITY

According to the present invention, there can be provided a wiring substrate for electronic component inspection apparatus in which, even when an axial external force is applied to the bolt portion or the nut tube portion of one of the plurality of studs joined to the back surface of the first laminate formed of ceramic, a crack is less likely to be generated in the ceramic in a region of the back surface of the first laminate, which region is located adjacent to the circumferential edge of the flange portion of the stud.

DESCRIPTION OF SYMBOLS

1: wiring substrate for electronic component inspection apparatus/wiring substrate
3: first laminate
4: second laminate
5, 7: front surface
6: back surface
15: pad for probe
16: metal layer
20a, 20b: stud
21: flange portion
22: inside surface
23: outside surface/sloping surface
23a, 23b: sloping surface
24: annular surface
26: bolt portion
28: nut tube portion
30: brazing material layer
c1-c3: ceramic layer
j1-j3: resin layer

What is claimed is:

1. A wiring substrate for electronic component inspection apparatus comprising a first laminate which is formed by stacking a plurality of ceramic layers and which has a front surface and a back surface, and a plurality of studs adhered to the back surface of the first laminate, the wiring substrate for electronic component inspection apparatus being characterized in that each of the studs is composed of a flange portion which is circular in bottom view, and a bolt portion or a nut tube portion which perpendicularly extends from a center portion of an outside surface of the flange portion; and the flange portion has a truncated conical shape and the outside surface from which the bolt portion or the nut tube portion protrudes, such that the outside surface slopes outward from a proximal end side of the bolt portion or a proximal end side of the nut tube portion toward a peripheral edge of the flange portion and gradually approaches an inside surface of the flange portion;

wherein each of the studs has an annular surface which has a length of 200 μm or less along an axial direction of the bolt portion or the nut tube portion and which is located between a peripheral edge of the outside surface of the flange portion of the stud and a peripheral edge of the inside surface of the flange portion of the stud.

2. The wiring substrate for electronic component inspection apparatus according to claim 1, wherein, in a vertical cross section along an axial direction of the bolt portion or the nut tube portion, the outside surface of the flange portion of the stud is defined by a single sloping line or a plurality of sloping lines.

3. The wiring substrate for electronic component inspection apparatus according to claim 1, wherein a second laminate formed by stacking a plurality of resin layers is disposed on the front surface of the first laminate, and a plurality of pads for probe is formed on a front surface of the second laminate.

4. The wiring substrate for electronic component inspection apparatus according to claim 1, wherein each of the studs is joined to the back surface of the first laminate via a brazing material layer which is disposed between the inside surface of the flange portion of the stud and a metal layer formed on the back surface of the first laminate.

* * * * *